United States Patent
Lin et al.

(10) Patent No.: US 11,830,918 B2
(45) Date of Patent: Nov. 28, 2023

(54) MEMORY DEVICE

(71) Applicant: TAIWAN SEMICONDUCTOR MANUFACTURING CO., LTD., Hsinchu (TW)

(72) Inventors: Yu-Chu Lin, Tainan (TW); Chi-Chung Jen, Kaohsiung (TW); Yen-Di Wang, Taipei (TW); Jia-Yang Ko, Kaohsiung (TW); Men-Hsi Tsai, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/837,641

(22) Filed: Jun. 10, 2022

(65) Prior Publication Data

US 2022/0302273 A1 Sep. 22, 2022

Related U.S. Application Data

(62) Division of application No. 16/746,631, filed on Jan. 17, 2020, now Pat. No. 11,362,185.

(51) Int. Cl.
| | |
|---|---|
| *H01L 21/00* | (2006.01) |
| *H01L 29/423* | (2006.01) |
| *H01L 29/788* | (2006.01) |
| *H01L 21/28* | (2006.01) |
| *H01L 29/66* | (2006.01) |
| *H10B 41/10* | (2023.01) |
| *H10B 41/30* | (2023.01) |

(52) U.S. Cl.
CPC .... *H01L 29/42324* (2013.01); *H01L 29/4011* (2019.08); *H01L 29/66825* (2013.01); *H01L 29/788* (2013.01); *H10B 41/10* (2023.02); *H10B 41/30* (2023.02)

(58) Field of Classification Search
CPC .......... H01L 29/42324; H01L 29/4011; H01L 29/788; H01L 29/66825
See application file for complete search history.

(56) References Cited

U.S. PATENT DOCUMENTS

| | | | |
|---|---|---|---|
| 5,453,391 A | 9/1995 | Yiu et al. | |
| 5,480,819 A | 1/1996 | Huang | |
| 6,143,609 A | 11/2000 | Sato et al. | |
| 6,242,306 B1 | 6/2001 | Pham et al. | |
| 2007/0141780 A1* | 6/2007 | Higashitani | H10B 41/10 438/257 |
| 2008/0318379 A1* | 12/2008 | Higashitani | H01L 23/552 438/257 |

* cited by examiner

*Primary Examiner* — Richard A Booth
(74) *Attorney, Agent, or Firm* — Maschoff Brennan

(57) ABSTRACT

A memory device is provided. The memory device includes a semiconductor substrate, a tunneling layer, a floating gate electrode, a dielectric layer, and a control gate electrode. The semiconductor substrate has an active region. The tunneling layer is over the active region of the semiconductor substrate. The floating gate electrode is over the tunneling layer. The floating gate electrode has a first portion and a second portion electrically connected to the first portion. The dielectric layer is over the floating gate electrode. The control gate electrode is over the dielectric layer. The control gate electrode has a first portion interposed between the first and second portions of the floating gate electrode.

20 Claims, 19 Drawing Sheets

MEMORY DEVICE

PRIORITY CLAIM AND CROSS-REFERENCE

This application is a divisional application of U.S. patent application Ser. No. 16/746,631, filed Jan. 17, 2020, now U.S. Pat. No. 11,362,185, issued Jun. 14, 2022, the entirety of which is incorporated by reference herein in its entirety.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Flash technology has enabled designers to create cost effective and high performance programmable SOC (system on chip) solutions through the use of split-gate flash memory cells. The aggressive scaling of memory cells enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
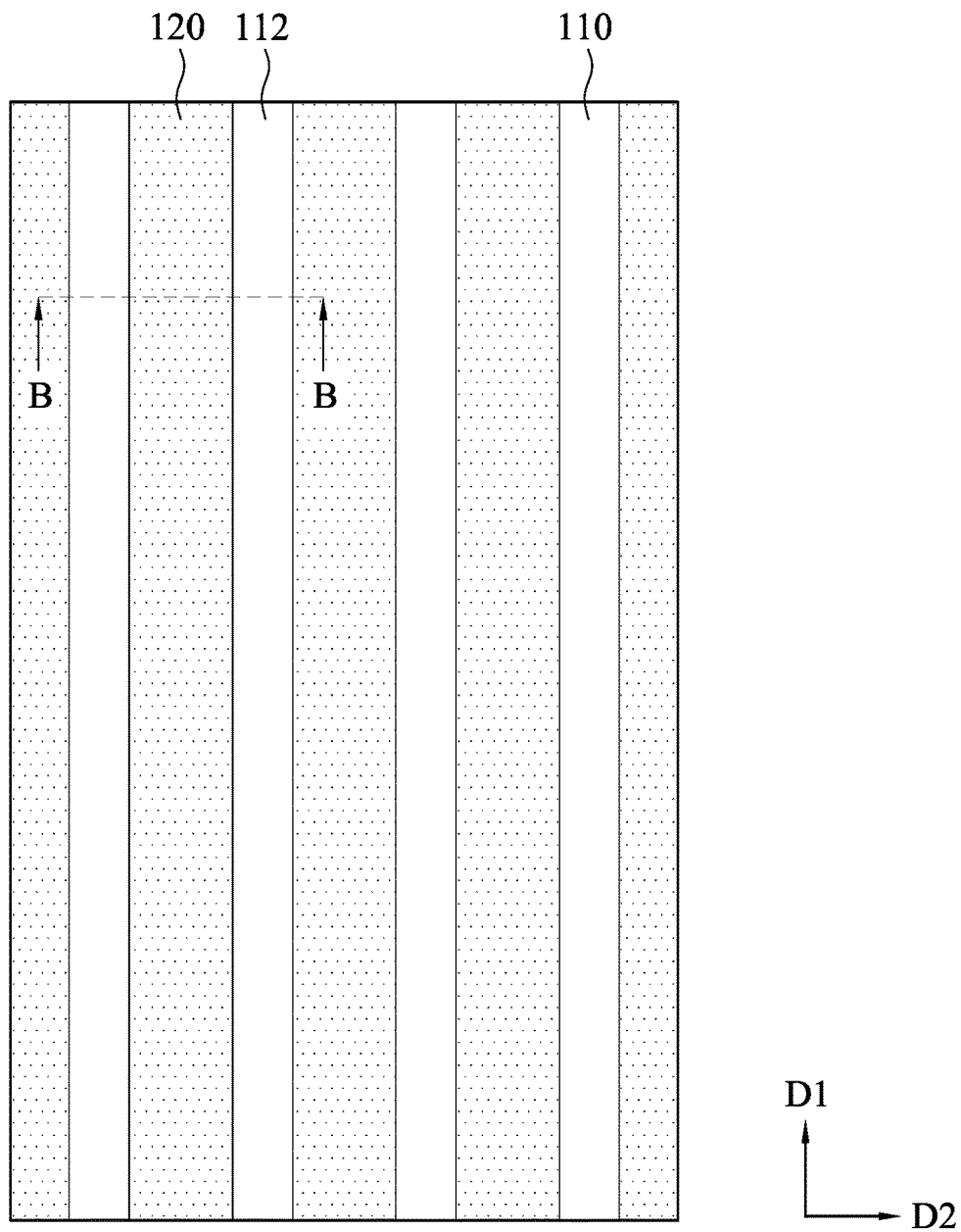
FIGS. 1A through 9C illustrate a method for fabricating a memory device at different stages in accordance with some embodiments of the present disclosure.
Figure 1B:
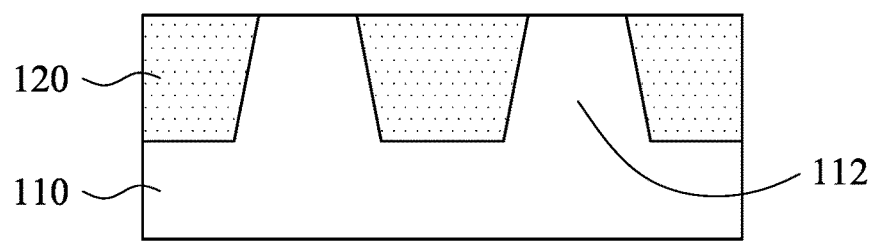

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A flash memory cell may include a transistor that has two gate structures. The first gate structure includes a floating gate where charge is stored. The floating gate also functions as a transistor gate forming a conductive path between source/drain regions of the substrate. The second gate structure includes a control gate positioned adjacent the floating gate but is separated from the floating gate by an interlevel dielectric. The application of a first voltage on the control gate results in charge tunneling through the dielectric and being stored in the floating gate. When charge is stored in the floating gate, the transistor is non-conductive and when charge is not stored in the floating gate, the transistor can be made conductive, e.g., by application of a pass voltage signal. Hence, the state of charge stored in the floating gate is indicative of the logical state of the flash memory cell.

The efficiency of program operation in flash memory cells is dependent on the coupling ratio between the control gate and the floating gate. In flash memory cells, a gate dielectric layer formed over a semiconductor region separates the floating gate from the semiconductor region. Charge is exchanged between the floating gate and the semiconductor region through the gate dielectric layer and the charging and discharging of the floating gate in this way constitute the programming and erasing operations. The control gate is separated from the floating gate by the interlevel dielectric so that the control gate is capacitively coupled to the floating gate and this coupling is utilized to control the voltage dropped across the gate dielectric. It is clearly advantageous to have as much of the applied potential as possible across the floating gate to semiconductor region dielectric thereby enhancing the efficiency of the programming and erase operations. Larger coupling ratios are thus desirable, in which a coupling ratio is essentially the ratio of the voltage drop across the gate dielectric to the voltage drop across the interlevel dielectric. Since the ratio of the voltage drop across the gate dielectric to the voltage drop across the interlevel dielectric is equal to the inverse of the ratio of the capacitances across these layers, the coupling ratio may be considered as the ratio of the control gate-floating gate capacitance to the floating gate-substrate capacitance, and it is beneficial to have the control gate-floating gate capacitance as large.

FIGS. 1A through 9C illustrate a method for fabricating a memory device at different stages in accordance with some embodiments of the present disclosure. It is understood that additional steps may be implemented before, during, or after the method, and some of the steps described may be replaced or eliminated for other embodiments of the method. FIG. 1A is a top view of the memory device according with some embodiments, and FIG. 1B is a cross-sectional view taking along line B-B of FIG. 1A. Reference is made to FIGS. 1A and 1B, where a substrate 110 is provided, and isolation structures 120 are formed in the substrate 110. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 may optionally doped with impurity ions such that it is lightly n-type or lightly p-type.

Isolation structures 120 are formed in the substrate 110 to separate and electrically isolate plural active regions 112 of the substrate 110 from each other. As shown in FIG. 1A, the isolation structures 120 extend along a direction D1, and the active regions 112 extend along the direction D1. The isolation structures 120 may include shallow trench isolation (STI) regions as shown. For example, formation of the isolation structures 120 may include etching trenches in the substrate 110, and then filling the trenches with a dielectric material, such as oxide. A planarization process may then be used to remove excess dielectric and to thereby confine this dielectric to the trench boundaries. In present embodiments, the isolation structures 120 may have top surfaces level with the top surface of the substrate 110. In some other embodiments, the isolation structures 120 may extend above the top surface of the substrate 110.

Figure 2A:
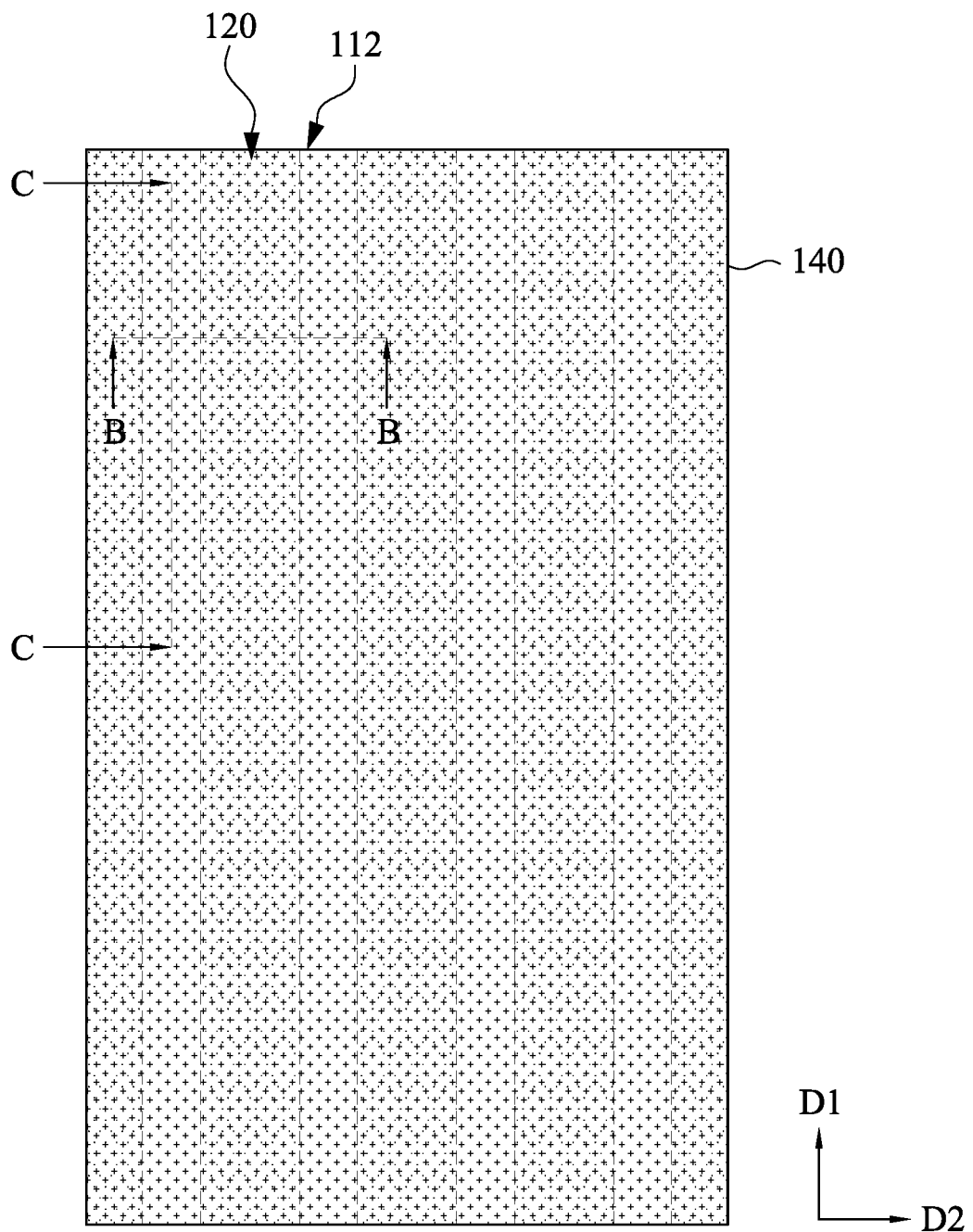
Figure 2B:
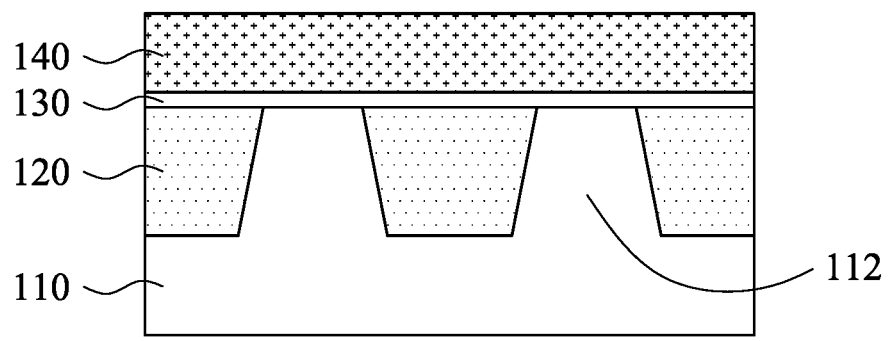
Figure 2C:
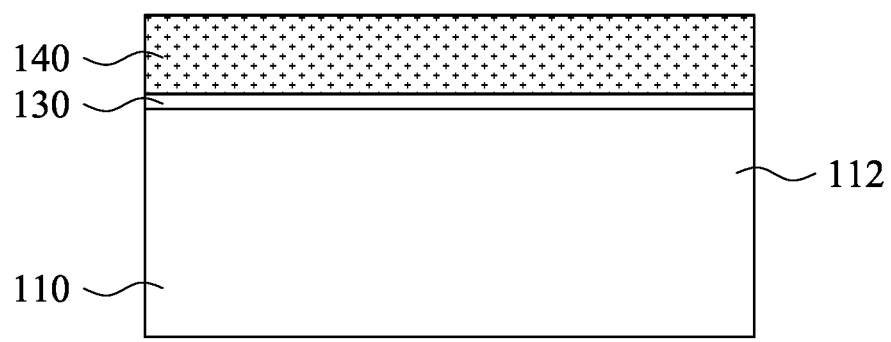

FIG. 2A is a top view of the memory device according with some embodiments, FIG. 2B is a cross-sectional view taking along line B-B of FIG. 2A, and FIG. 2C is a cross-sectional view taking along line C-C of FIG. 2A. Reference is made to FIGS. 2A-2C, where a tunneling film 130 and a floating gate film 140 are conformally formed over the substrate 110. In some embodiments, the tunneling film 130 may include, for example, a dielectric material such as silicon dioxide ($SiO_2$), silicon nitride ($Si_3N_4$), oxynitrides (SiON), high-k materials, other non-conductive materials, or combinations thereof. The tunneling film 130 may be formed using thermal oxidation, chemical vapor deposition (CVD), physical vapor deposition (PVD), atomic layer deposition (ALD), ozone oxidation, other suitable processes, or combinations thereof. The floating gate film 140 may include polysilicon formed through, for example, low pressure CVD (LPCVD) methods, CVD methods and PVD sputtering methods employing suitable silicon source materials. The floating gate film 140 may include other gate electrode material such as metal, metal alloys, single crystalline silicon, or combinations thereof. The floating gate film 140 may be doped or non-doped. If doped, then this doping may be performed via an in-situ introduction of dopant ions into the deposition process or via a subsequent ion implantation.

Figure 3A:
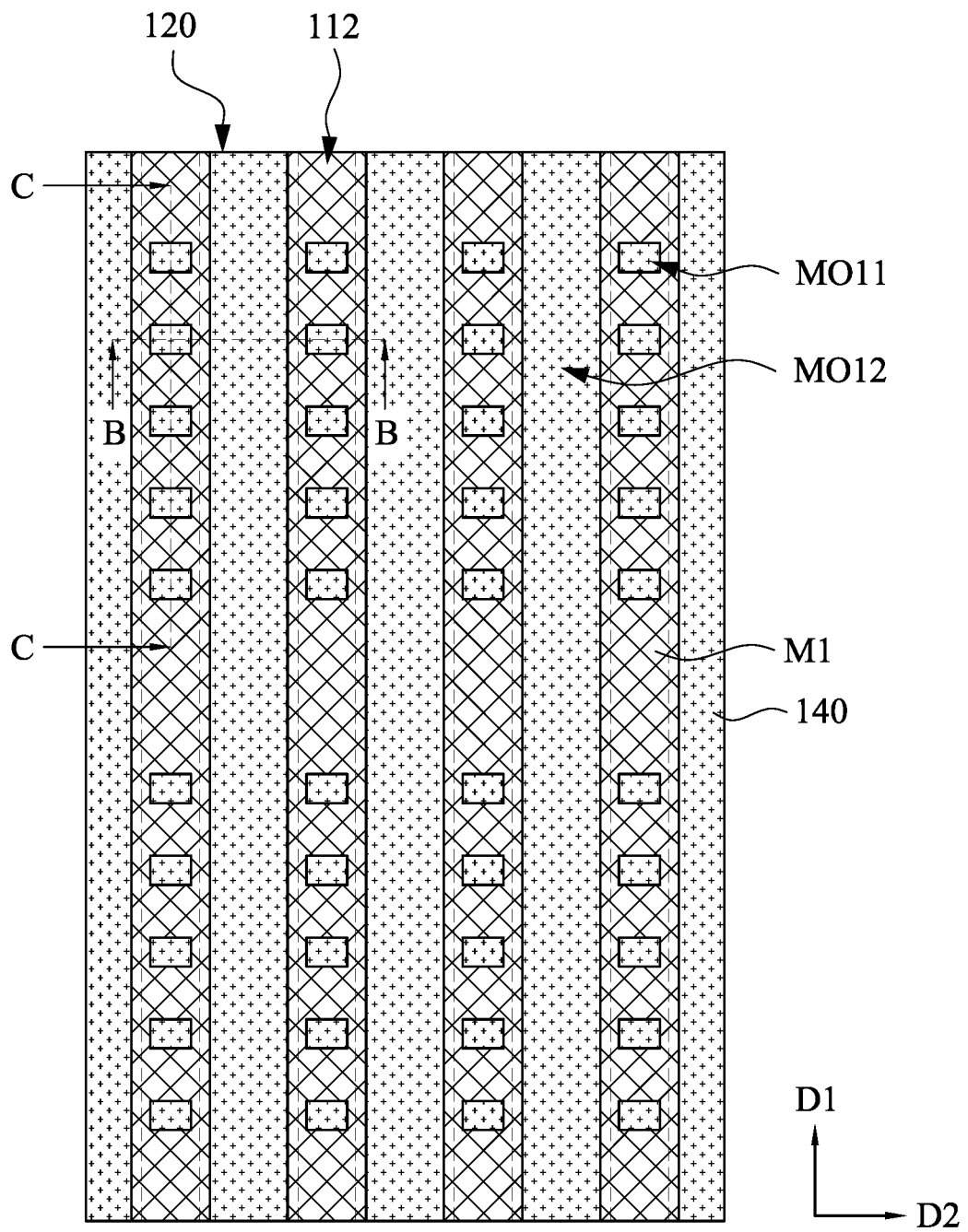
Figure 3B:
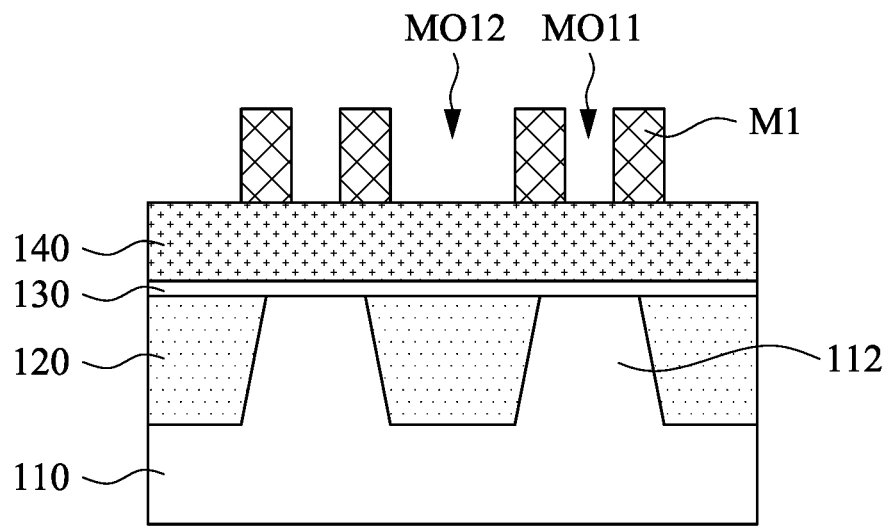
Figure 3C:
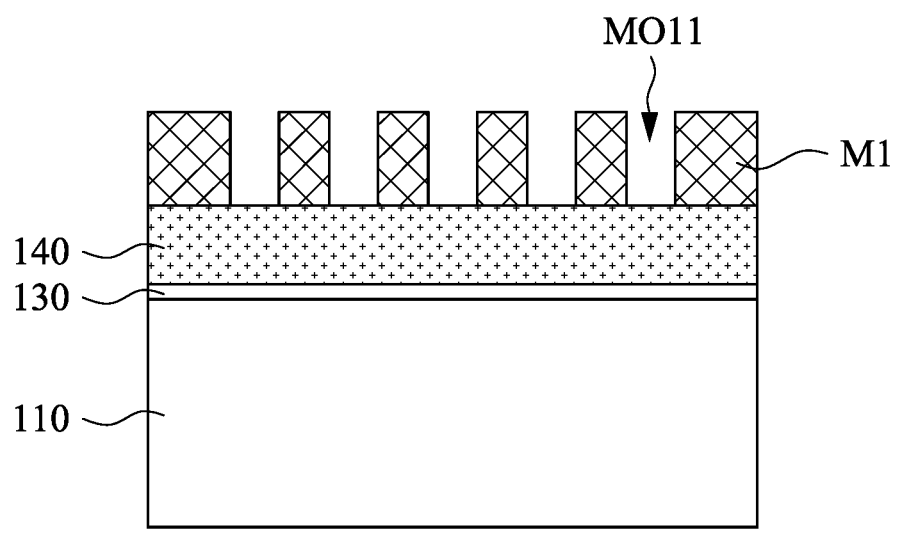

FIG. 3A is a top view of the memory device according with some embodiments, FIG. 3B is a cross-sectional view taking along line B-B of FIG. 3A, and FIG. 3C is a cross-sectional view taking along line C-C of FIG. 3A. In some embodiments, a mask layer M1, such as photoresists, hard masks (e.g., silicon nitride or silicon oxynitride), combinations thereof, or multi-layers thereof, may be formed over the floating gate film 140. Then, the mask layer M1 is patterned by a lithography process and an etching process, thereby forming openings MO11 and MO12 in the mask layer M1 exposing the underlying floating gate film 140. To be specific, the openings MO11 exposes portions of the floating gate film 140 over the active regions 112, and the opening MO12 exposes portions of the floating gate film 140 over the isolation structures 120. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process may include dry etching, wet etching, and/or other etching methods (e.g., reactive ion etching).

Figure 4A:
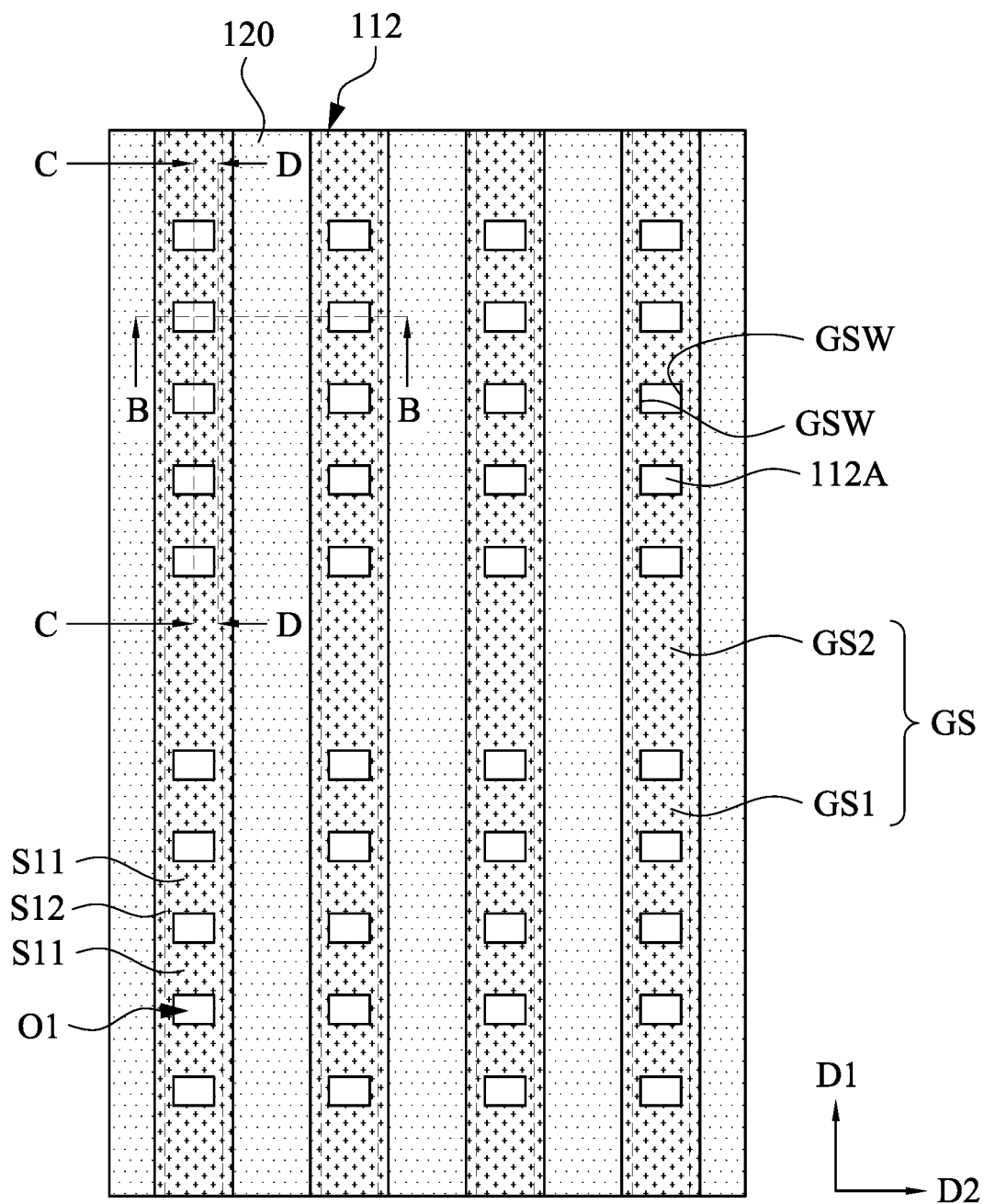
Figure 4B:
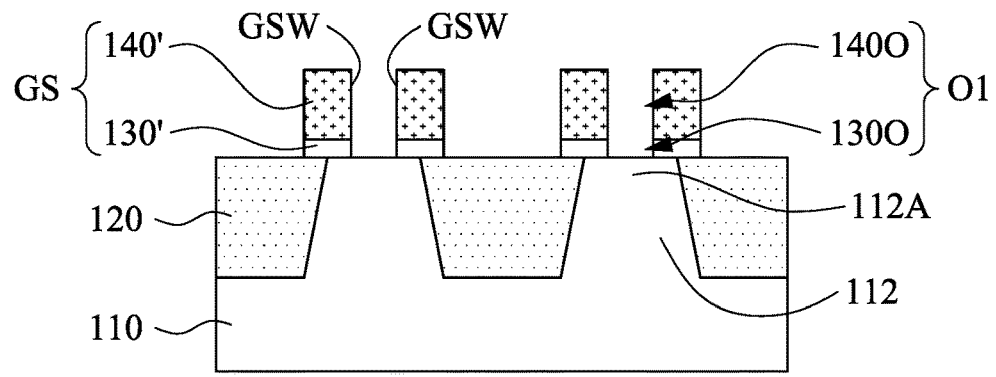
Figure 4C:
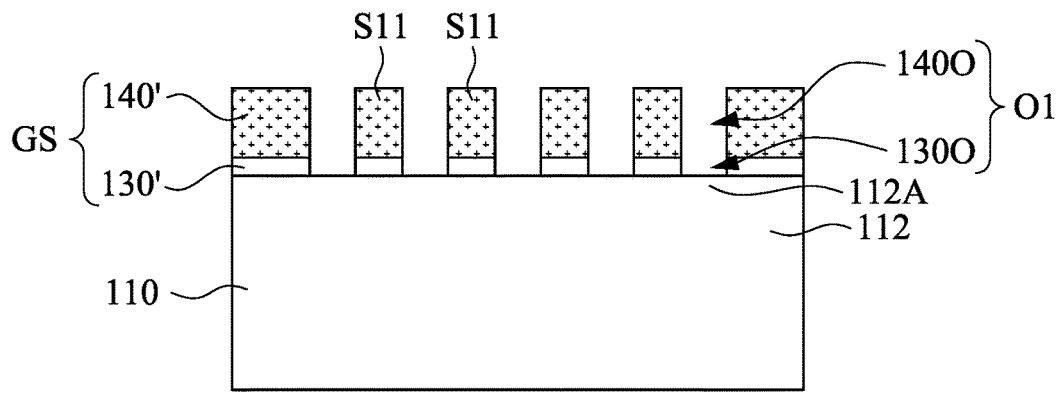
Figure 4D:
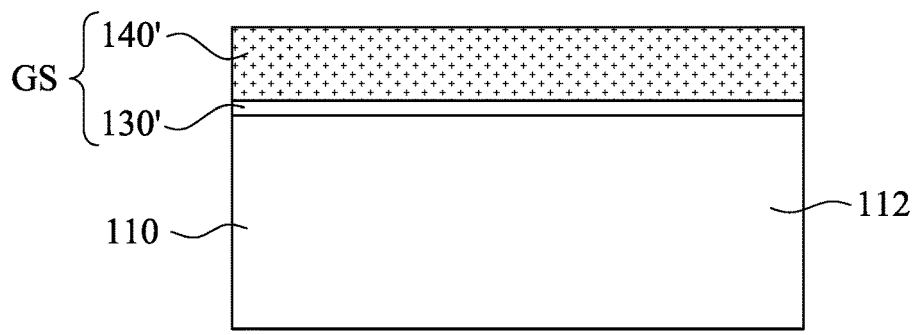

FIG. 4A is a top view of the memory device according with some embodiments, FIG. 4B is a cross-sectional view taking along line B-B of FIG. 4A, FIG. 4C is a cross-sectional view taking along line C-C of FIG. 4A, and FIG. 4D is a cross-sectional view taking along line D-D of FIG. 4A. Reference is made to FIGS. 4A-4D, the floating gate film 140 and the tunneling film 130 (referring to FIGS. 3A-3C) are respectively patterned into plural floating gate electrodes 140' and plural tunneling layers 130' over the active regions 112. For example, one or more etching process are applied to the floating gate film 140 and the tunneling film 130 (referring to FIGS. 3A-3C) through the openings MO11 and MO12 of the mask layer M1 (referring to FIGS. 3A-3C), thereby removing portions of the floating gate film 140 and portions of the tunneling film 130 uncovered by the patterned mask layer M1 (referring to FIGS. 3A-3C), and remaining portions of the floating gate film 140 and the tunneling film 130 under the patterned mask layer M1 (referring to FIGS. 3A-3C). The remaining portions of the floating gate film 140 and the tunneling film 130 (referring to FIGS. 3A-3C) may be referred to as the floating gate electrodes 140' and the tunneling layers 130' hereinafter. For clear illustration, one of the floating gate electrodes 140' and one of the tunneling layers 130' below said one of the floating gate electrodes 140' are in combination referred to as a gate stack GS hereinafter. After the etching processes, the patterned mask layer M1 (referring to FIGS. 3A-3C) is then removed, and the removal method may be performed by solvent stripping or plasma ashing, for example.

In some embodiments of the present disclosure, the gate stacks GS extend along the direction D1 which the active regions 112 and the isolation structures 120 extend along, and the gate stacks GS are over the active regions 112 respectively. In some embodiments of the present disclosure, each of the active regions 112 has at least one area 112A not covered by the gate stacks GS. For example, each of the gate stacks has two sidewalls GSW facing each other, and the sidewalls GSW are spaced apart to expose the area 112A. In some embodiments, the gate stacks GS include plural portions S11 and S12, in which the portions S11 are spaced apart from each other in the direction D1 for exposing the area 112A of the active regions 112, and the portions S12 extends along the direction D1 and connecting the first portions S11 to each other. Control gate electrode may be formed between the portions S11 of the gate stacks GS in subsequent fabrication process. The separation of the portions S11 of the gate stacks GS increase a surface area of a dielectric layer between the floating gate electrode and the formed control gate electrode of a formed memory device, thereby increasing the control gate-floating gate capacitance, which in turn will increase the coupling ratio therebetween.

In further embodiments, each of the gate stacks GS may have openings O1 exposing the areas 112A of the underlying active regions 112. To be specific, each of the floating gate electrodes 140' has openings 140O, each of the tunneling layers 130' has openings 130O respectively communicated with the openings 140O, and a combination of one of the openings 130O and the corresponding one of the openings 140O is referred to as one of the openings O1. In some embodiments, each of the gate stacks GS may include plural openings O1, for example, arranged along the direction D1. In some other embodiments, the openings O1 of each of the gate stacks GS may be arranged in a two-dimensional array in the directions D1 and D2. That is, some openings O1 of each of the gate stacks GS may be arranged along the direction D2. Control gate electrode may be formed in the openings O1 in subsequent fabrication process. The openings O1 in the gate stacks GS increase a surface area of a dielectric layer between the floating gate electrode and the formed control gate electrode of a formed memory device, thereby increasing the control gate-floating gate capacitance, which in turn will increase the coupling ratio therebetween. In the present embodiments, the two portions S1 are connected to each other by two portions S12, thereby forming an opening surrounded by the portions S11 and S12 at four sides. In some other embodiments, the two portions S11 may be connected to each other by a single portion S12, and therefore the gate stacks GS may has a comb shape without having an opening therein.

In some embodiments of the present disclosure, each of the gate stacks GS may have parts GS1 and GS2 extending along the direction D1. The parts GS1 may have the separate portions S11 or the openings O1, and therefore expose the underlying active regions 112. The parts GS2 may connect the parts GS1 to each other. In the present embodiments, the parts GS2 may cover the underlying active regions 112 and free of openings. In some other embodiments, the parts GS2 have similar structure with the part GS1. For example, the parts GS2 have separate portions or openings for exposing the underlying active regions 112.

Figure 5A:
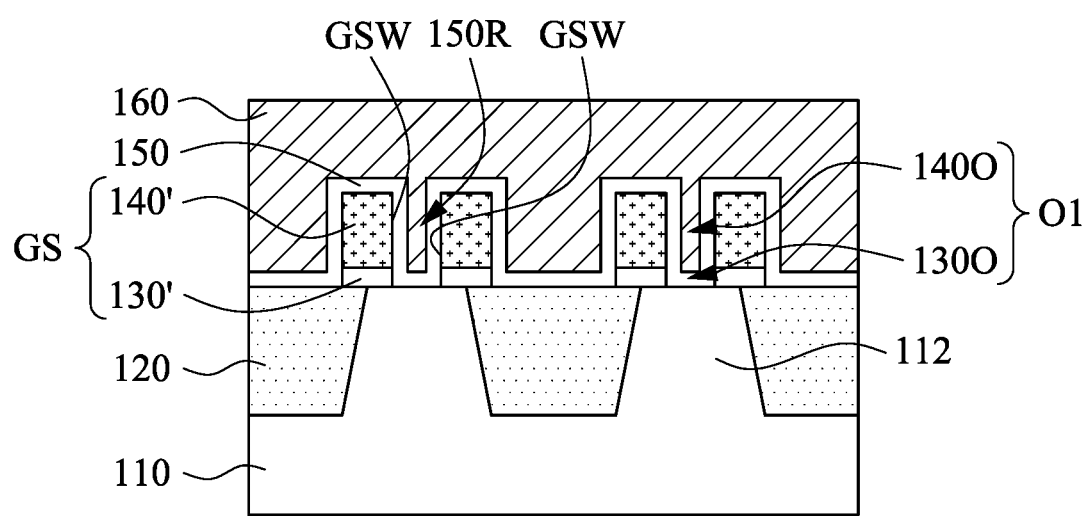
Figure 5B:
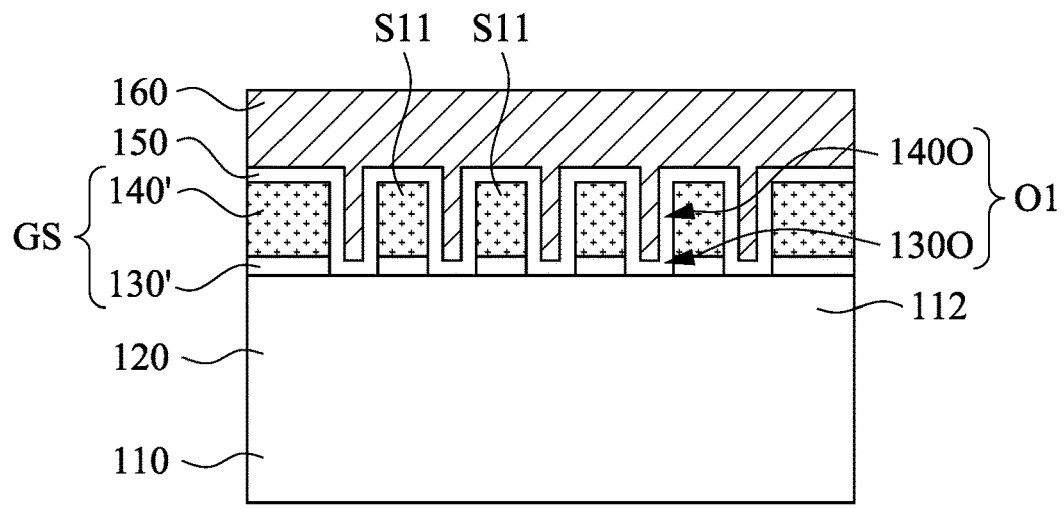
Figure 5C:
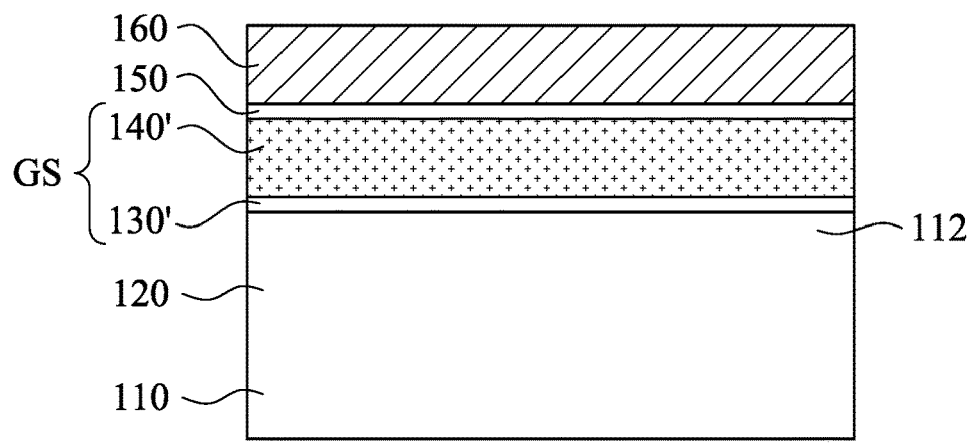

Referring to FIGS. 5A to 5C, where the cross-sectional positions of FIGS. 5A to 5C are the same as the cross-sectional position of FIGS. 4B to 4D. A dielectric film 150 is conformally formed over the structure of FIGS. 4A to 4D. To be specific, the dielectric film 150 may extends into the openings O1 (e.g., a combination of the opening 130O and 140O) and conformally extend along top surfaces of the substrate 110, sidewalls of the gate stacks GS, top surfaces of the gate stacks GS, and top surfaces of the isolation structures 120. The dielectric film 150 may have recesses 150R conforming to the profile of the openings O1. In some embodiments, the dielectric film 150 and the tunneling layer 130' may have the same or different materials. That is, the dielectric film 150 may include, for example, a dielectric material such as silicon dioxide ($SiO_2$), silicon nitride ($Si_3N_4$), oxynitrides (SiON), high-k materials, other non-conductive materials, or combinations thereof. In some embodiments, the dielectric film may be a stack layer including a first silicon oxide layer, a silicon nitride layer and a second oxide layer are sequentially deposited on the semiconductor substrate 110. That is, the dielectric film may include an oxide-nitride-oxide (ONO) stack structure. The layers of the dielectric film 150 may be formed using chemical vapor deposition (CVD), physical vapor deposition (PVD), atomic layer deposition (ALD), ozone oxidation, other suitable processes, or combinations thereof.

A control gate film 160 is conformally formed over the dielectric film 150. To be specific, the control gate film 160 may overfill the recesses 150R in the dielectric film 150 and the opening O1 of the gate stack GS. The control gate film 160 may include polysilicon formed through, for example low pressure CVD (LPCVD) methods, CVD methods and PVD sputtering methods employing suitable silicon source materials. If desired, the control gate film 160 may be ion implanted to the desired conductive type. It is to be appreciated other gate electrode material such as metal, metal alloys, single crystalline silicon, or combinations thereof.

Figure 6A:
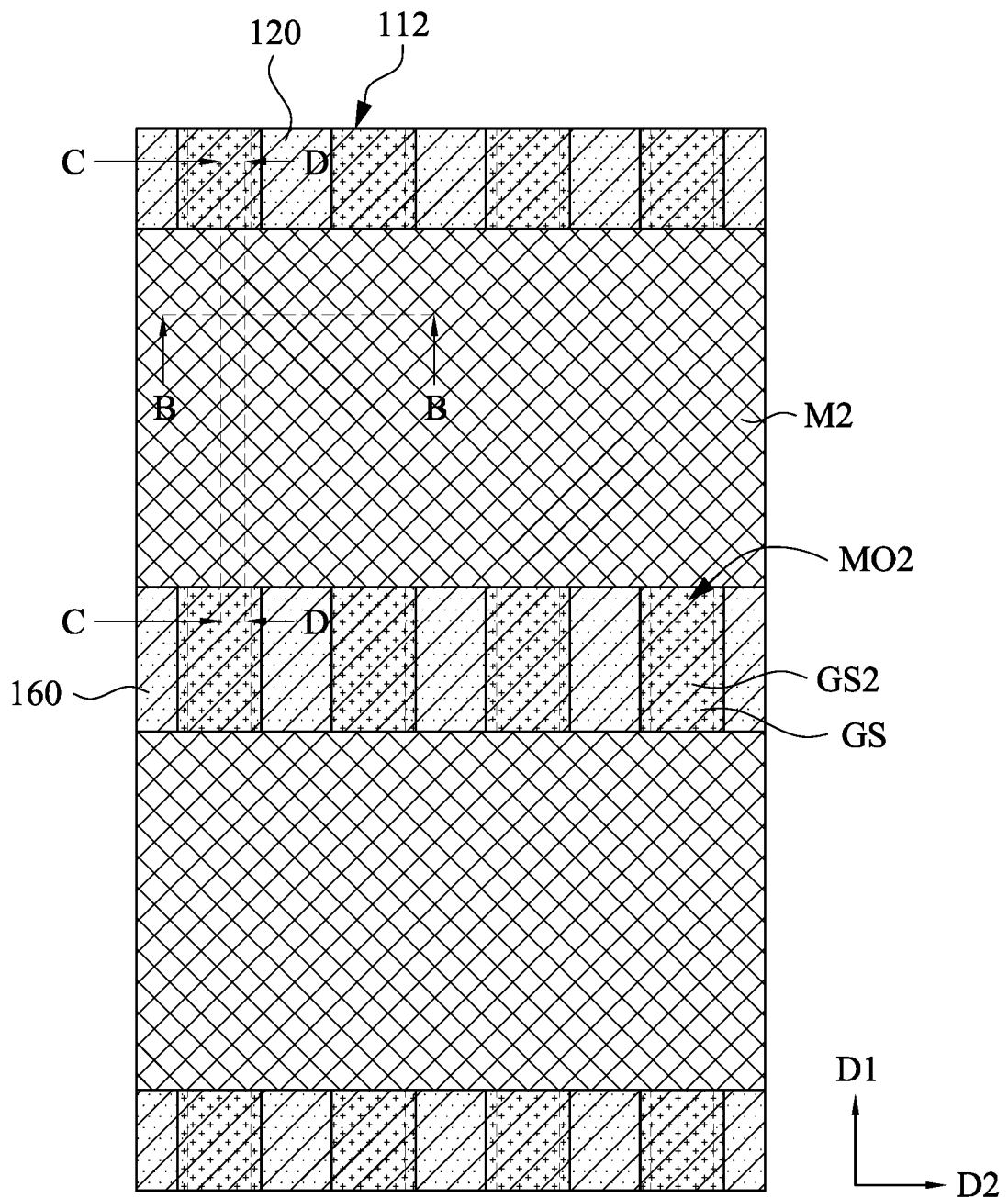
Figure 6B:
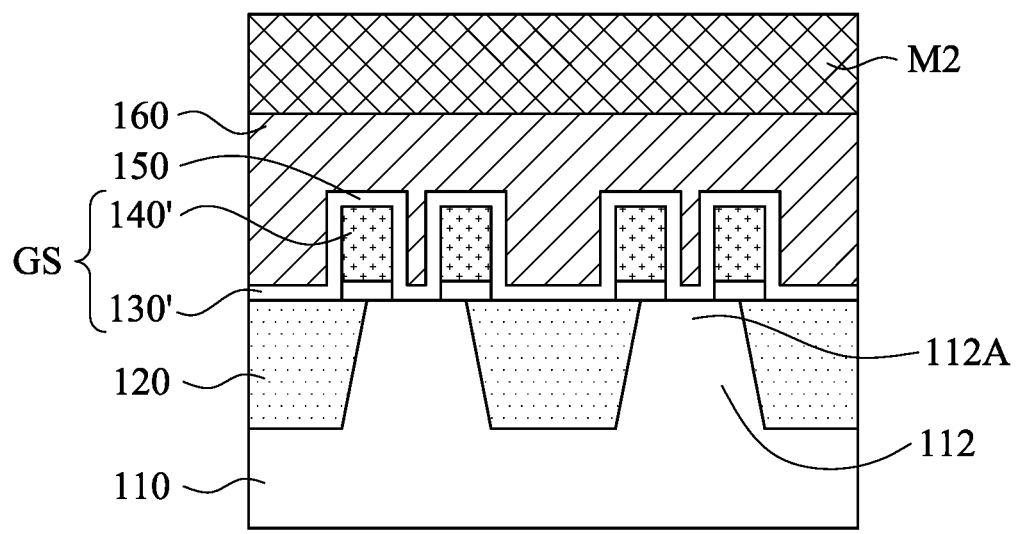
Figure 6C:
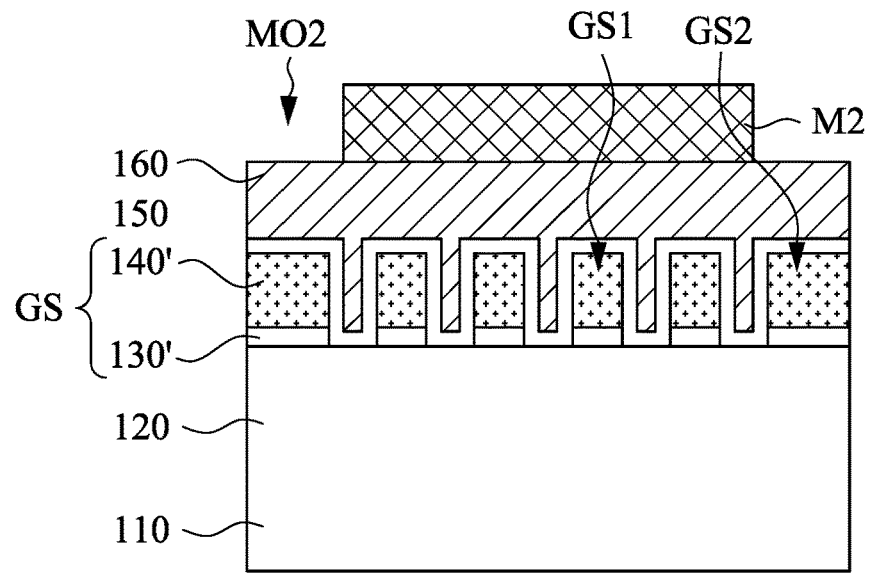
Figure 6D:
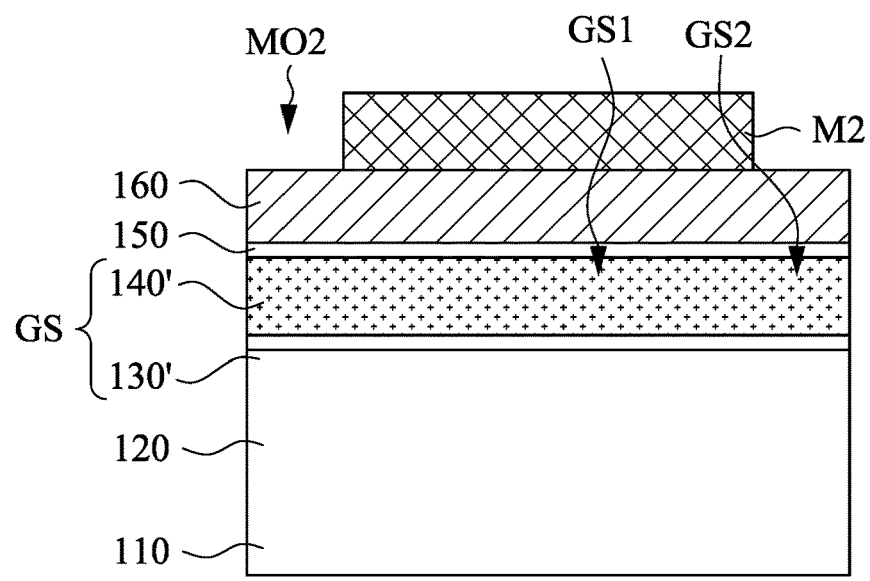

FIG. 6A is a top view of the memory device according with some embodiments, FIG. 6B is a cross-sectional view taking along line B-B of FIG. 6A, FIG. 6C is a cross-sectional view taking along line C-C of FIG. 6A, and FIG. 6D is a cross-sectional view taking along line D-D of FIG. 6A. A mask layer M2, such as photoresists, hard masks (e.g., silicon nitride or silicon oxynitride), combinations thereof, or multi-layers thereof, may be formed over the control gate film 160. Then, the mask layer M2 is patterned by a lithography process and an etching process, thereby forming openings MO2 in the mask layer M2, exposing the underlying control gate film 160 within the openings MO2. For example, the patterned mask layer M2 may cover a portion of the control gate film 160 over the part GS1 of the gate stack GS (referring to FIGS. 5A-5C), and expose another portion of the control gate film 160 over the part GS2 of the gate stack GS. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process may include dry etching, wet etching, and/or other etching methods (e.g., reactive ion etching).

Figure 7A:
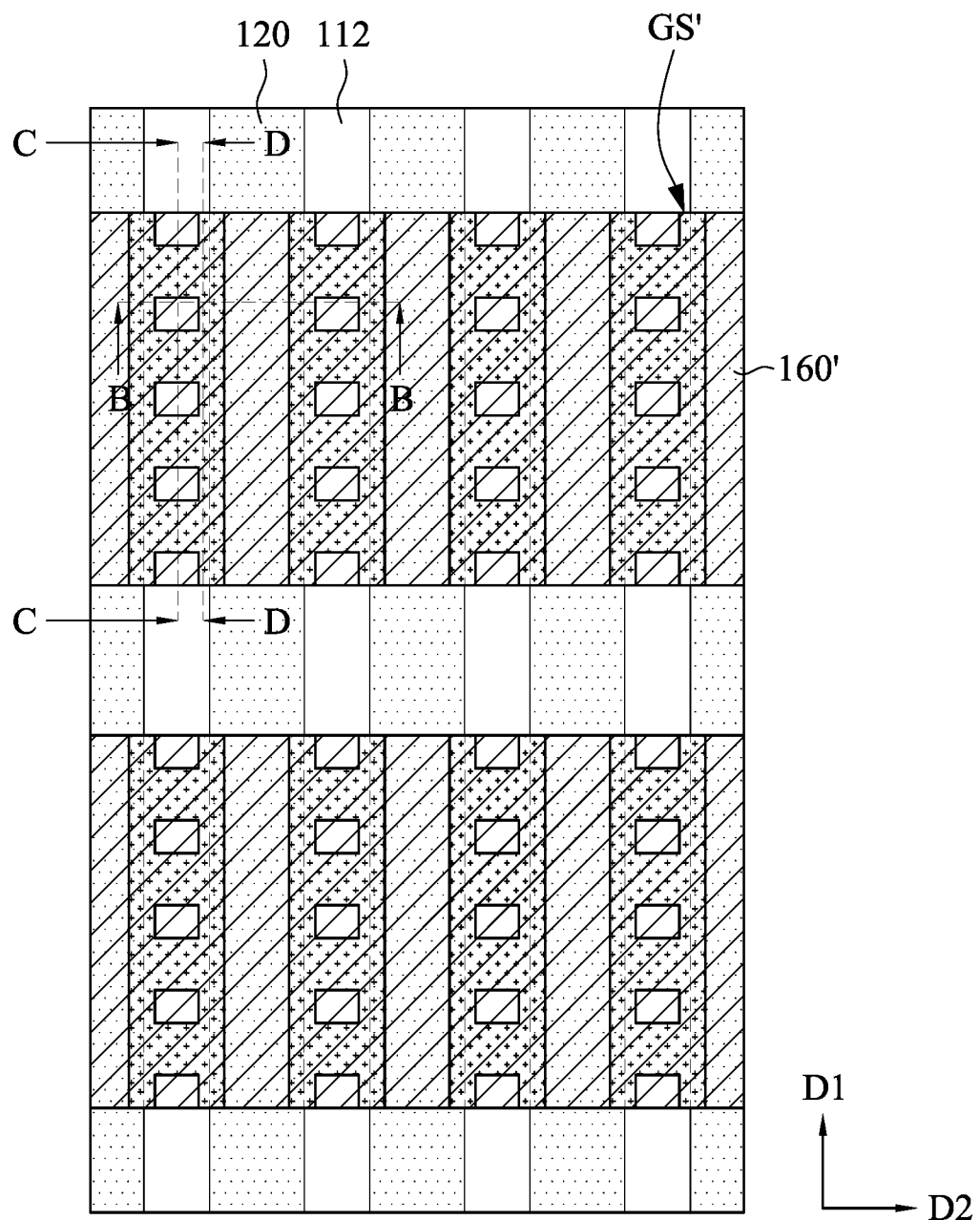
Figure 7B:
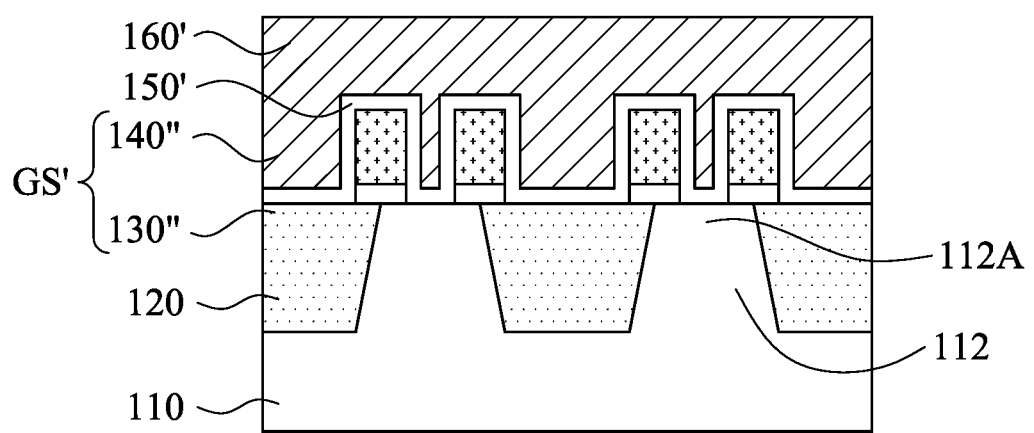
Figure 7C:
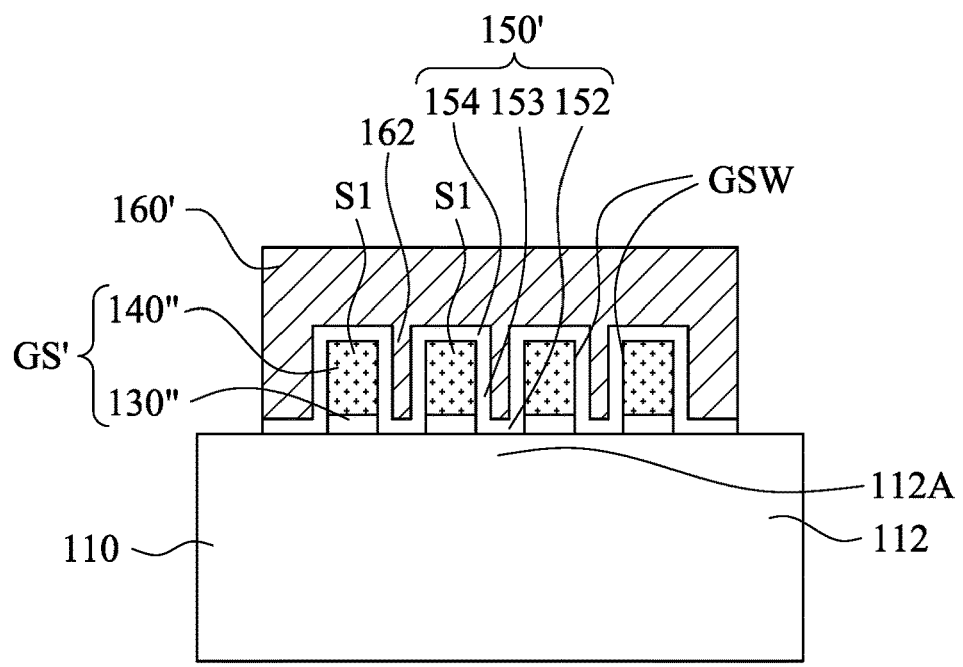
Figure 7D:
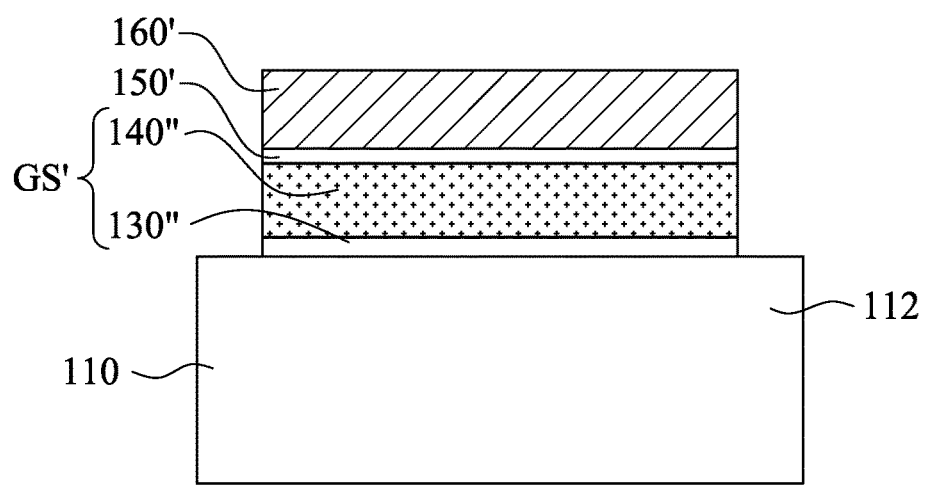

FIG. 7A is a top view of the memory device according with some embodiments, FIG. 7B is a cross-sectional view taking along line B-B of FIG. 7A, FIG. 7C is a cross-sectional view taking along line C-C of FIG. 7A, and FIG. 7D is a cross-sectional view taking along line D-D of FIG. 7A. The control gate film 160, the dielectric film 150, and the gate stack GS (referring to FIGS. 5A-5C) are respectively patterned into plural control gate electrodes 160', plural dielectric layers 150', and plural gate stack GS' by one or more suitable etching processes. For example, one or more etching processes are applied to the control gate film 160, the dielectric film 150, and the gate stack GS (referring to FIGS. 6A-6D) through the openings MO2 of the mask layer M2 (referring to FIGS. 6A-6D). Portions of the control gate film 160 over the part GS1 of the gate stack GS, portions of the dielectric film 150 over the part GS1 of the gate stack GS, and the part GS1 of the gate stack GS (referring to FIGS. 6A-6D) covered by the patterned mask layer M2 (referring to FIGS. 6A-6D) are protected from the one or more etching processes, and may be respectively referred to as control gate electrodes 160', dielectric layers 150', and gate stacks GS' after the one or more etching processes.

To be specific, in some embodiments, a first etching process is performed to remove portions of the control gate film 160 uncovered by the mask layer M2 (referring to FIGS. 6A-6D), and remain portions of the control gate film 160 below the mask layer M2 (referring to FIGS. 6A-6D), thereby patterning the control gate film 160 into the control gate electrode 160'. Subsequently, a second etching process is performed to remove portions of the dielectric film 150 uncovered by the mask layer M2 (referring to FIGS. 6A-6D), and remains portions of the dielectric film 150 below the mask layer M2 (referring to FIGS. 6A-6D), thereby patterning the dielectric film 150 into the dielectric layer 150'. Then, a third etching process is performed to remove the part GS2 of the gate stack GS (referring to FIGS. 6A-6D) uncovered by the patterned mask layer M2 (referring to FIGS. 6A-6D), and remains the part GS1 of the gate stack GS, thereby patterning the gate stack GS into the gate stack GS'. Each of the gate stacks GS' may include a tunneling layer 130" and a floating gate electrode 140", in which the tunneling layers 130" are patterned from one of the tunneling layers 130', and the floating gate electrodes 140" are patterned from one of the floating gate electrodes 140'.

The control gate electrodes 160' and the dielectric layers 150' are at least over the area 112A of the active region 112. For example, the control gate electrodes 160' and the dielectric layers 150' has a portion between the two portions S11 of the gate stack GS'. In other words, the control gate electrode 160' has a portion 162 between the two sidewalls GSW of the gate stack GS' facing each other. The dielectric layers 150' may have a portion 152 between the control gate electrode 160' and the area 112A of the active region 112, a portion 153 between the control gate electrode 160' and the sidewall GSW of the gate stack GS', and a portion 154 between the control gate electrode 160' and a top surface of the gate stack GS'. In some embodiments, the control gate electrodes 160' and the dielectric layers 150' may be over the gate stacks GS'. In some embodiments, the control gate electrodes 160' and the dielectric layers 150' extends along a direction D2 substantially orthogonal to the direction D1. After the etching processes, the patterned mask layer M2 (referring to FIGS. 6A-6C) is then removed, and the removal method may be performed by solvent stripping or plasma ashing, for example.

Figure 8A:
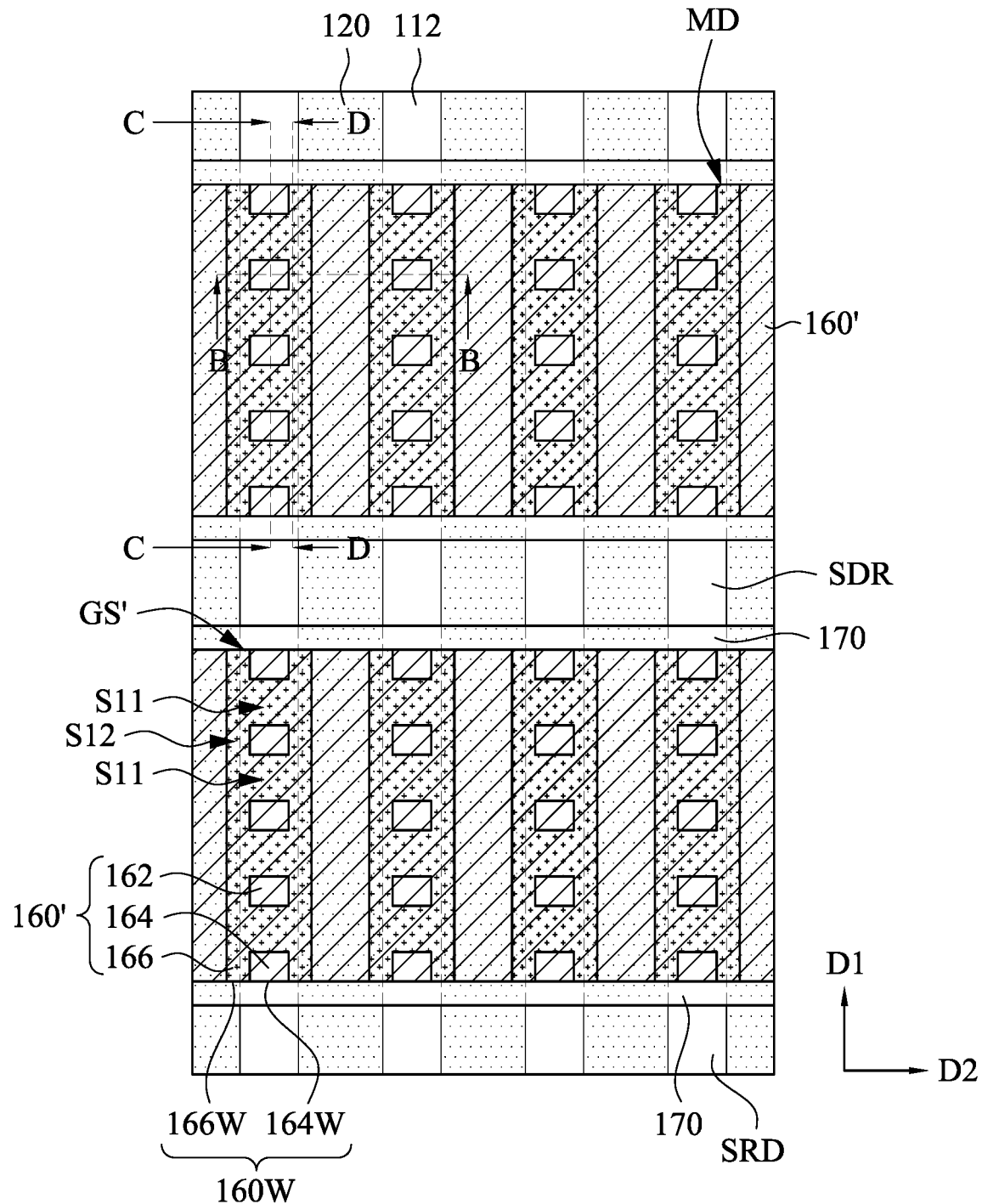
Figure 8B:
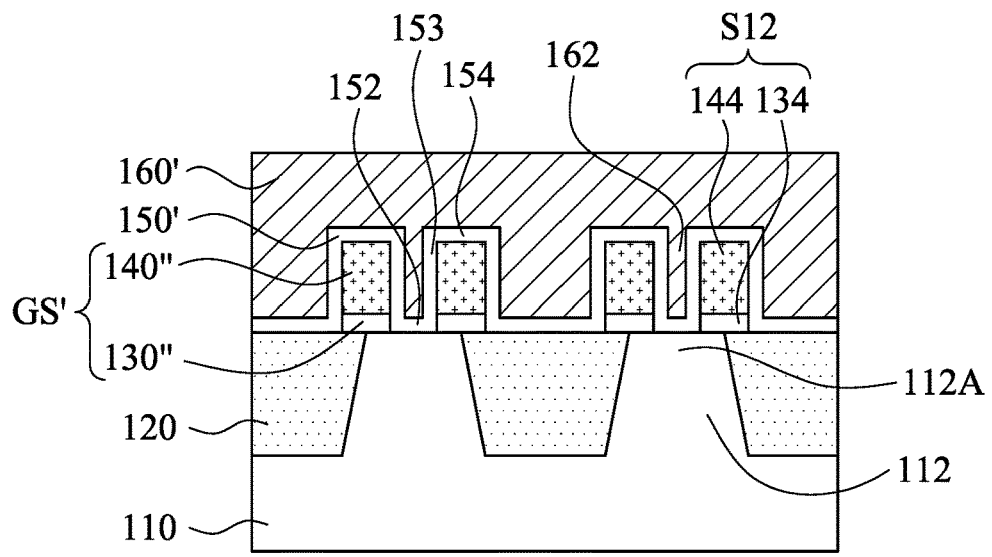
Figure 8C:
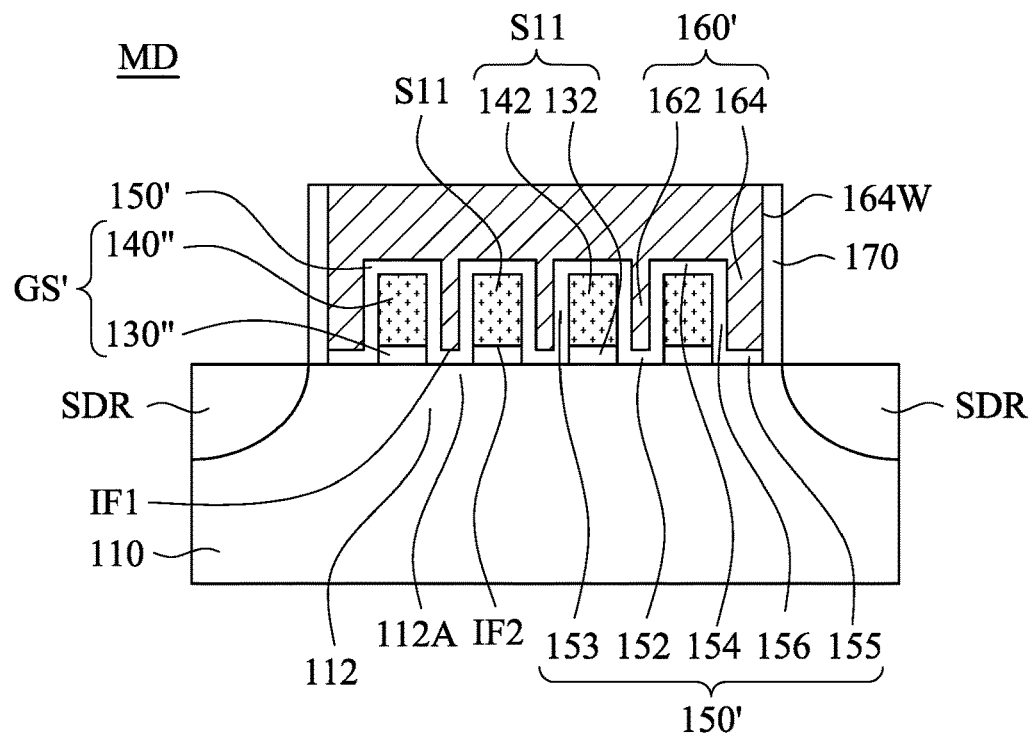
Figure 8D:
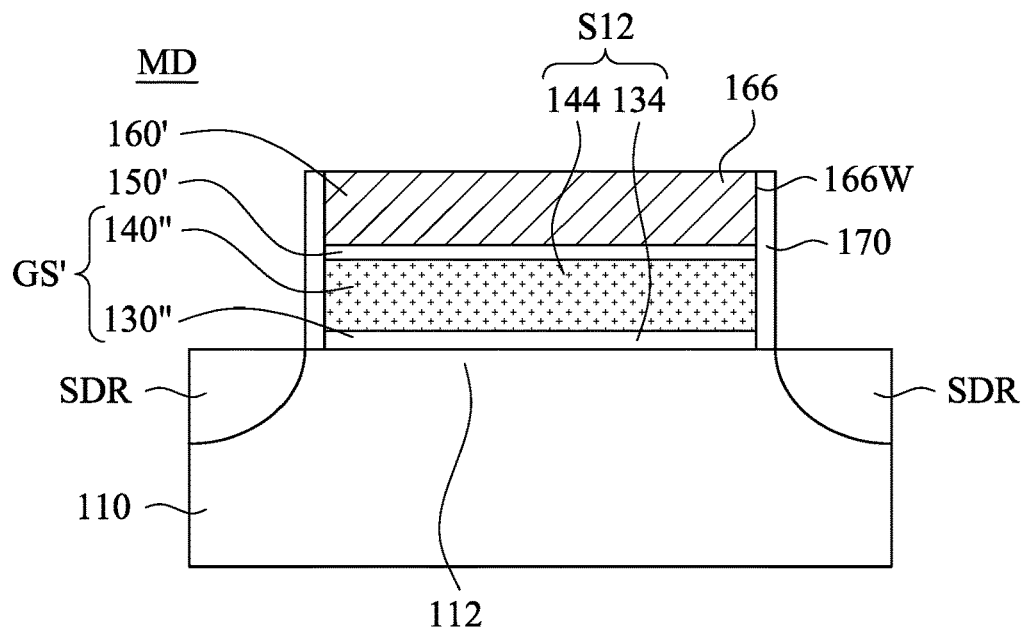

FIG. 8A is a top view of the memory device according with some embodiments, FIG. 8B is a cross-sectional view taking along line B-B of FIG. 8A, FIG. 8C is a cross-sectional view taking along line C-C of FIG. 8A, and FIG. 8D is a cross-sectional view taking along line D-D of FIG. 8A. Gate spacers 170 are respectively formed on opposite sidewalls of a stack of the control gate electrode 160' and the dielectric layers 150'. In some embodiments, the gate spacers 170 may include suitable dielectric materials, such as silicon oxide, silicon nitride, silicon oxynitride, the like, or the combination thereof. The gate spacers 170 may include plural dielectric layers. For example, the gate spacers 170 may include an inner silicon oxide layer, a middle silicon nitride layer, and an outer silicon oxide layer. In some embodiments, a dielectric film may be conformally formed over the structure of FIGS. 7A to 7D, and an etching process (e.g., dry etch process) is performed to remove the horizontal portions of the dielectric film and remain vertical portions of the dielectric film, thereby forming the gate spacers 170.

After the formation of the gate spacers 170, source/drain regions SDR are formed in the substrate 110. For example, one or more ion implantation processes are performed to the substrate 110, thereby forming the source/drain regions SDR. The source/drain regions SDR may be formed be the same or different ion implantation processes.

Through the configuration, plural memory devices MD are formed. Each of the memory devices MD includes a gate stack GS', a dielectric layer 150' over the gate stack GS', and a control gate electrode 160' over the dielectric layer 150'. The dielectric layer 150' may include an ONO dielectric structure, thereby reducing the junction leakage between the floating gate and control gate, which in turn will reduce drain disturb. Each of the memory devices MD may further include a pair of gate spacers 170 alongside sidewalls 160W of the control gate electrode 160', sidewalls of the dielectric layer 150', and sidewalls of the gate stack GS'.

As aforementioned, the gate stack GS' has portions S11 and S12, in which the portions S11 are spaced apart from each other in the direction D1, and the portions S12 extend along the direction D1 and connecting the first portions S11 to each other. Each of the portions S11 of the gate stack GS' may include a portion 142 of the floating gate electrode 140" and a portion 132 of the tunneling layer 130". Each of the portions S12 of the gate stack GS' may include a portion 144 of the floating gate electrode 140" and a portion 134 of the tunneling layer 130". As the configuration of the gate stack GS', the portions 142 of the floating gate electrode 140" are spaced apart from each other in the direction D1, and the portions 144 of the floating gate electrode 140" extend along the direction D1 and connecting the portions 142 of the floating gate electrode 140" to each other. As the configuration of the gate stack GS', the portion 132 of the tunneling layer 130" are spaced apart from each other in the direction D1, and the portions 134 of the tunneling layer 130" extend along the direction D1 and connecting the portions 132 of the tunneling layer 130" to each other.

In some embodiments, the control gate electrode 160' may have portions 162 and 164. The portions 162 may be interposed between the portions S11 of the gate stack GS' (e.g., the portions 142 of the floating gate electrode 140' and/or the portions 132 of the tunneling layer 130"), and the portion 164 may be interposed between the gate stack GS' (e.g., the portion 142 of the floating gate electrode 140' and/or the portion 132 of the tunneling layer 130") and one of the gate spacers 170. In some embodiments, the portions 162 may further be interposed between the portions S12 of the gate stack GS' (e.g., the portions 144 of the floating gate electrode 140' and/or the portions 134 of the tunneling layer 130").

In some embodiments, the dielectric layer 150' may have portions 152-156. To be specific, in the present embodiments, the portions 152 of the dielectric layer 150' extends along a top surface of the substrate 110, and may be interposed between the portions S11 of the gate stack GS' (e.g., the portions 132 of the tunneling layer 130"). In the present embodiments, the portions 153 of the dielectric layer 150' extend along sidewalls of the gate stack GS', and the portions 153 of the dielectric layer 150' may be interposed between the portions S11 of the gate stack GS' (e.g., the portions 142 of the floating gate electrode 140"). In the present embodiments, the portions 154 of the dielectric layer 150' extends along the top surfaces of the gate stacks GS', and the portions 154 of the dielectric layer 150' may be between the top surface of the gate stack GS' and the control gate electrode 160'. In the present embodiments, the portions 155 of the dielectric layer 150' extends along the top surface of the substrate 110, the portions 153 of the dielectric layer 150' extend along sidewalls of the gate stack GS', and the portions 155 and 156 of the dielectric layer 150' may be interposed between the gate stack GS' and one of the gate spacers 170.

In some embodiments, a bottom surface of the dielectric layer 150' is lower than a bottom surface of the floating gate electrode 140". For example, the portions 152 and 155 of the dielectric layer 150' may be in contact with the areas 112A of the active regions 112. Through the configuration, the dielectric layer 150' has side portions 153, 156, and top portions 154 between the gate stacks GS' and the control gate electrode 160'. Compared to another memory device having a flat dielectric layer between control gate electrode and floating gate electrode, a surface area of the dielectric layer 150' between the floating gate electrode 140" and the control gate electrode 160' of the memory device MD may be increased by the configuration of the side portions 153 and 156 of the dielectric layer 150', thereby increasing the control gate-floating gate capacitance, which in turn will increase the coupling ratio therebetween. For example, in the present embodiments, a width of the openings O1 and the thickness of the floating gate electrode 140" are designed such that, a combination of four side portions 153 around one of the openings O1 may have a surface area greater than that of a portion 152 of the dielectric layer 150' at the bottom of the one of the openings O1.

In the present embodiments, a bottom interface IF1 between the dielectric layer 150' and the control gate electrode 160' is substantially level with an interface IF2 between the tunneling layer 130' and the floating gate electrode 140". In some other embodiments, the bottom interface IF1 between the dielectric layer 150' and the control gate electrode 160' may be higher than or lower than the interface IF2 between the tunneling layer 130' and the floating gate electrode 140" In some other embodiments where the bottom interface IF1 is lower than the interface IF2, the portion 162 of the control gate electrode 160' may be between the portions 142 of the floating gate electrode 140" and between the portions 132 of the tunneling layer 130'. In some other embodiments wherein the bottom interface IF1 is higher than the interface IF2, the portion 152 of the dielectric layer 150' may be between the portions 132 of the tunneling layer 130' and between the portions 142 of the floating gate electrode 140".

In the present embodiments, the portion 164 of the control gate electrode 160', the portion 155 of the dielectric layer 150', and the gate spacers 170 cover and passivate sidewalls of the floating gate electrode 140", such that a leakage current from sidewalls of the floating gate electrode 140" to the source/drain region SDR is reduced, thereby enhancing data retention. In some embodiments, the control gate electrode 160' has the portion 164 and a portion 166 adjacent to the gate spacers 170, in which the portion 166 is above a top surface of the floating gate electrode 140". To be specific, the portion 164 of the control gate electrode 160' may have a sidewall 164W adjacent to the gate spacers 170, a bottom end of the sidewall 164W is at a position below a top surface of the floating gate electrode 140". The portion 166 of the control gate electrode 160' may have a sidewall 166W adjacent to the gate spacers 170, and a bottom end of the sidewall 166W is at a position above the top surface of the floating gate electrode 140". As such, the sidewalls 160W of the control gate electrode 160' adjacent to the gate spacers 170 has a bottom line extending ups and down according to the profile of the gate stack GS'.

Figure 9A:
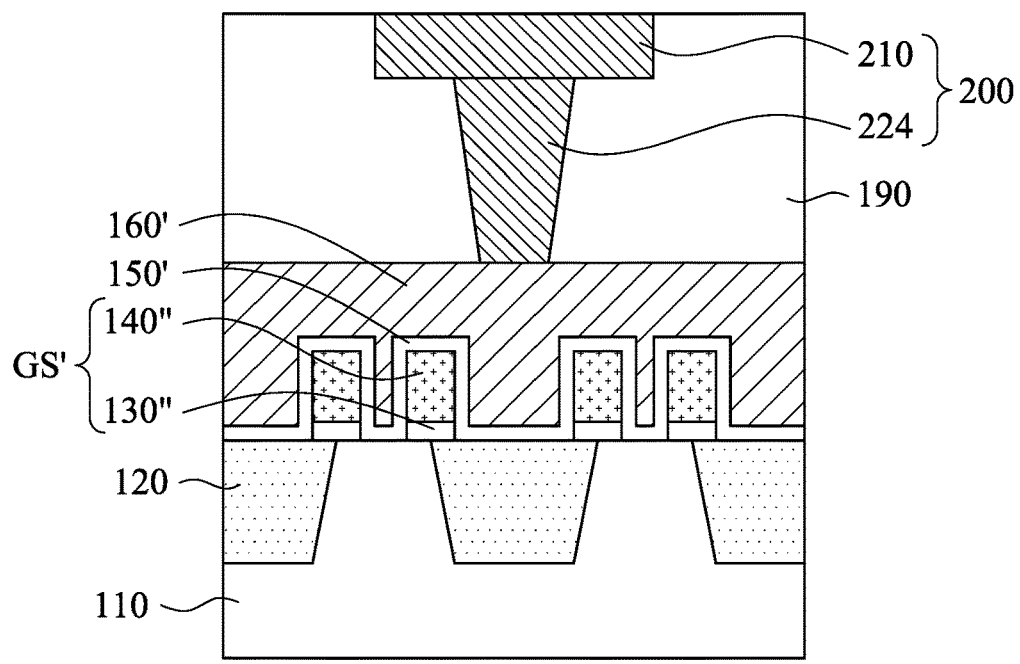
Figure 9B:
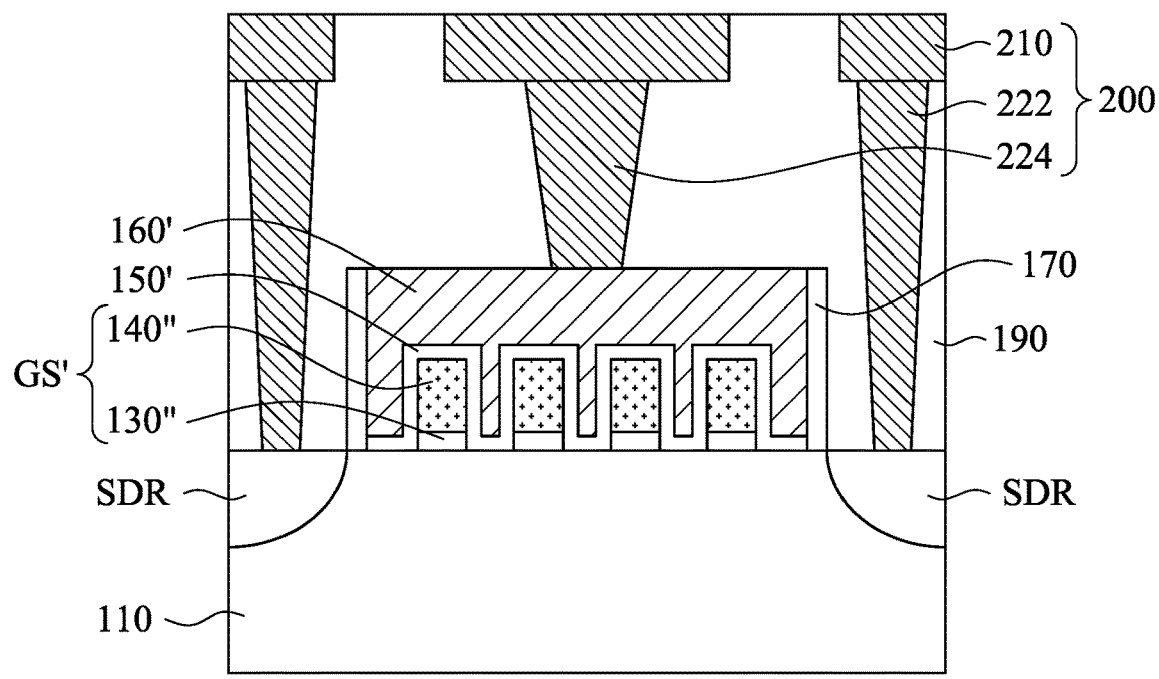
Figure 9C:
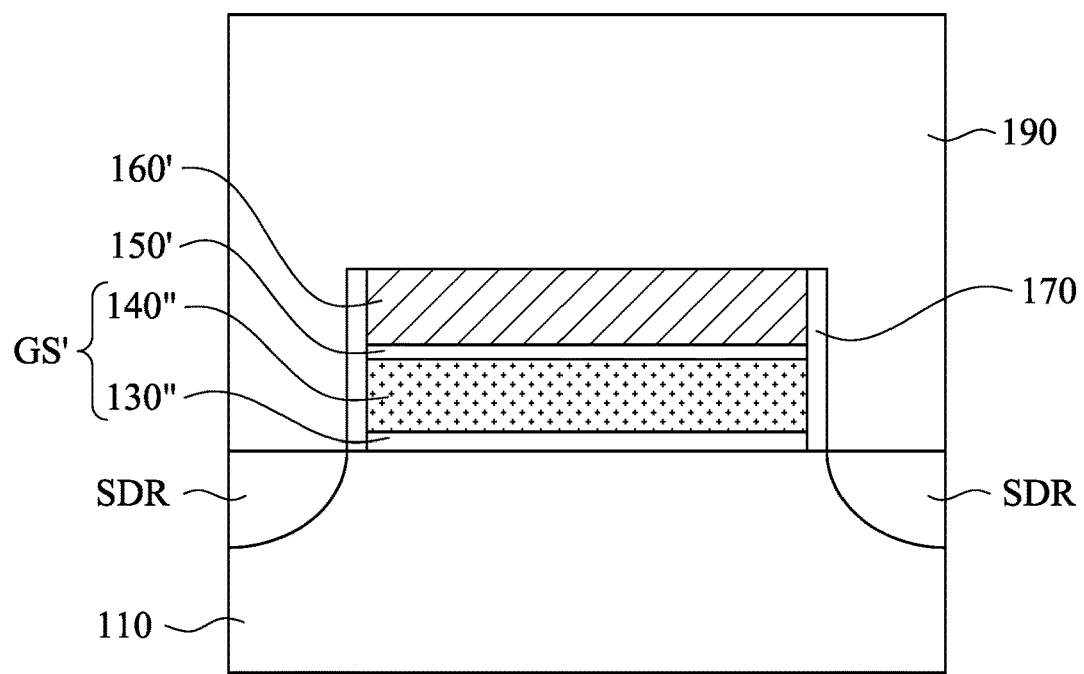

Referring to FIGS. 9A to 9C, where the cross-sectional positions of FIGS. 9A to 9C are the same as the cross-sectional position of FIGS. 8B to 8D. An interlayer dielectric (ILD) layer 190 is formed over the structure of FIGS. 8A-8D, and then a metallization pattern 200 is formed in the ILD layer 190. The ILD layer 190 is formed of a dielectric material such as Phospho-Silicate Glass (PSG), Boro-Silicate Glass (BSG), Boron-Doped Phospho-Silicate Glass (BPSG), or the like. The ILD layer 190 has a top surface higher than the top surface of the control gate electrode 160'. A CMP may optionally be performed to planarize the top surface of the of ILD layer 190. The metallization pattern 200 may include plural contacts, plural vias, and plural metal layers connected with the memory devices MD. For example, the metallization pattern 200 includes at least one metal layer 210 and plural contacts 222, 224. The contacts 220 may connect the source/drain regions SDR to the metal layer 210, and the contact 224 may connect the control gate electrodes 160' to the metal layer 210. The metal layers and contacts of the metallization pattern 200 may include aluminum, aluminum alloy, copper, copper alloy, titanium, titanium nitride, tantalum, tantalum nitride, tungsten, the like, and/or combinations thereof.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that openings in the floating gate stacks increase a surface area of a dielectric layer between the floating gate electrode and the control gate electrode of a memory device, thereby increasing the control gate-floating gate capacitance, which in turn will increase the coupling ratio therebetween. Another advantage is that due to the isolation of the spacers and the control gate electrode, a leakage current from sidewalls of the floating gate electrode is reduced, thereby enhancing data retention. Still another advantage is that due to the ONO dielectric structure, the junction leakage between the floating gate and control gate is reduced, thereby reducing drain disturb.

According to some embodiments of the present disclosure, a memory device is provided. The memory device includes a semiconductor substrate, a tunneling layer, a floating gate electrode, a dielectric layer, and a control gate electrode. The semiconductor substrate has an active region. The tunneling layer is over the active region of the semiconductor substrate. The floating gate electrode is over the tunneling layer. The floating gate electrode has a first portion and a second portion electrically connected to the first portion. The dielectric layer is over the floating gate electrode. The control gate electrode is over the dielectric layer. The control gate electrode has a first portion interposed between the first and second portions of the floating gate electrode.

According to some embodiments of the present disclosure, a memory device is provided. The memory device includes a semiconductor substrate, a tunneling layer, a floating gate electrode, a dielectric layer, a control gate electrode, a gate spacer, and a source/drain region. The tunneling layer is over the semiconductor substrate. The floating gate electrode is over the tunneling layer. The dielectric layer is over the floating gate electrode. The control gate electrode is over the dielectric layer. The gate spacer is on a sidewall of the control gate electrode. The control gate electrode has a first portion over a top surface of the floating gate electrode and a second portion between a sidewall of the floating gate electrode and the gate spacer. The source/drain region is at a side of the gate spacer opposite the control gate electrode.

According to some embodiments of the present disclosure, a memory device is provided. The memory device includes a semiconductor substrate, an insolation structure, a floating gate structure, and a control gate structure. The insolation structure is over the semiconductor substrate and surrounds an active region of the semiconductor substrate. The floating gate structure is over the active region. The control gate structure extends over the floating gate structure and the insolation structure. The control gate structure has a first portion over the insolation structure and a second portion over the active region. The floating gate structure has a first sidewall forming a closed loop encircling the second portion of the control gate structure from a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
   a semiconductor substrate having an active region;
   a tunneling layer over the active region of the semiconductor substrate;
   a floating gate electrode over the tunneling layer, wherein the floating gate electrode has a first portion, a second portion electrically connected to the first portion, and a third portion connecting the first portion of the floating gate electrode to the second portion of the floating gate electrode;
a dielectric layer over the floating gate electrode; and
a control gate electrode over the dielectric layer, wherein the control gate electrode has a first portion interposed between the first and second portions of the floating gate electrode.

2. The memory device of claim 1, further comprising:
a plurality of isolation structures laterally surrounding the active region of the semiconductor substrate, wherein the first portion of the control gate electrode is over the active region of the semiconductor substrate.

3. The memory device of claim 2, wherein one or both of the first and second portions of the floating gate electrode extends across a boundary between the isolation structures and the active region of the semiconductor substrate.

4. The memory device of claim 1, wherein the dielectric layer has a first portion directly below the first portion of the control gate electrode, and the first portion of the dielectric layer spaces the first portion of the control gate electrode from the semiconductor substrate.

5. The memory device of claim 4, wherein the tunneling layer has a first portion and a second portion respectively below the first and second portions of the floating gate electrode, and the first portion of the dielectric layer is interposed between the first and second portions of the tunneling layer.

6. The memory device of claim 1, further comprising:
a gate spacer alongside the control gate electrode and the floating gate electrode, wherein the control gate electrode has a second portion interposed between the floating gate electrode and the gate spacer.

7. The memory device of claim 1, wherein a bottom surface of the dielectric layer is lower than a bottom surface of the floating gate electrode.

8. The memory device of claim 1, wherein the floating gate electrode further has a fourth portion connecting the first portion of the floating gate electrode to the second portion of the floating gate electrode, and the first portion of the control gate electrode is interposed between the third and fourth portions of the floating gate electrode.

9. A memory device, comprising:
a semiconductor substrate;
a tunneling layer over the semiconductor substrate;
a floating gate electrode over the tunneling layer;
a dielectric layer over the floating gate electrode;
a control gate electrode over the dielectric layer;
a gate spacer on a sidewall of the control gate electrode, wherein the control gate electrode has a first portion over a top surface of the floating gate electrode and a second portion between a sidewall of the floating gate electrode and the gate spacer, and a top end of the gate spacer is higher than a topmost portion of a bottom surface of the control gate electrode; and
a source/drain region at a side of the gate spacer opposite the control gate electrode.

10. The memory device of claim 9, wherein the second portion of the control gate electrode is between a first segment of the sidewall of the floating gate electrode and the gate spacer, and the gate spacer is further on a second segment of the sidewall of the floating gate electrode.

11. The memory device of claim 10, wherein the first segment of the sidewall of the floating gate electrode is laterally offset from the second segment of the sidewall of the floating gate electrode, and the sidewall of the floating gate electrode further has a third segment connecting the first segment of the sidewall of the floating gate electrode to the second segment of the sidewall of the floating gate electrode.

12. The memory device of claim 10, wherein the dielectric layer has a portion on the first segment of the sidewall of the floating gate electrode.

13. The memory device of claim 9, wherein the dielectric layer has a portion directly below the second portion of the control gate electrode, and the portion of the dielectric layer spaces the second portion of the control gate electrode from the semiconductor substrate.

14. A memory device, comprising:
a semiconductor substrate;
an isolation structure over the semiconductor substrate and laterally surrounding an active region of the semiconductor substrate;
a floating gate structure over the active region; and
a control gate structure extending over the floating gate structure and the isolation structure, wherein the control gate structure has a first portion over the isolation structure and a second portion over the active region from a cross-sectional view, and the floating gate structure has a first inner sidewall forming a closed loop encircling the second portion of the control gate structure from a top view.

15. The memory device of claim 14, wherein the control gate structure comprises a dielectric layer and a control gate electrode over the dielectric layer, the dielectric layer is in contact with the first inner sidewall of the floating gate structure.

16. The memory device of claim 14, wherein the control gate structure comprises a dielectric layer and a control gate electrode over the dielectric layer, and the dielectric layer is in contact with the active region.

17. The memory device of claim 14, wherein the control gate structure comprises a dielectric layer and a control gate electrode over the dielectric layer, and the dielectric layer is in contact with the isolation structure.

18. The memory device of claim 14, wherein the control gate structure further has a third portion over the active region, and the floating gate structure has a second inner sidewall forming a U shape surrounding the third portion of the control gate structure from the top view.

19. The memory device of claim 18, further comprising:
a gate spacer alongside the third portion of the control gate structure.

20. The memory device of claim 1, wherein the first portion of the floating gate electrode, the second portion of the floating gate electrode, and the third portion of the floating gate electrode are substantially at the same level.

* * * * *